United States Patent
Kang et al.

(10) Patent No.: US 11,737,315 B2
(45) Date of Patent: Aug. 22, 2023

(54) DISPLAY PANEL COMPRISING HEAT DISSIPATION MEMBER AND DISPLAY APPARATUS INCLUDING THE SAME

(71) Applicant: LG Display Co., Ltd., Seoul (KR)

(72) Inventors: MinJoo Kang, Paju-si (KR); JooHwan Shin, Paju-si (KR); Dohyung Kim, Paju-si (KR); MinHo Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/672,611

(22) Filed: Feb. 15, 2022

(65) Prior Publication Data

US 2022/0173350 A1    Jun. 2, 2022

Related U.S. Application Data

(63) Continuation of application No. 16/886,614, filed on May 28, 2020, now Pat. No. 11,283,056.

(30) Foreign Application Priority Data

Jun. 4, 2019 (KR) .................. 10-2019-0066221

(51) Int. Cl.
*H10K 50/87* (2023.01)
*H10K 50/842* (2023.01)

(52) U.S. Cl.
CPC ......... *H10K 50/87* (2023.02); *H10K 50/8426* (2023.02)

(58) Field of Classification Search
None
See application file for complete search history.

(56) References Cited

U.S. PATENT DOCUMENTS

| 2013/0087769 | A1* | 4/2013 | Son | H01L 51/5243 |
| | | | | 257/40 |
| 2015/0207095 | A1* | 7/2015 | Mun | H01L 51/5256 |
| | | | | 257/40 |
| 2020/0371570 | A1* | 11/2020 | Wang | H01L 51/529 |

FOREIGN PATENT DOCUMENTS

CN    109600964 A    4/2019

OTHER PUBLICATIONS

European Patent Office, Extended European Search Report and Opinion. EP Patent Application No. 20177197.9, dated Oct. 1, 2020, 12 pages.
United States Office Action, U.S. Appl. No. 16/886,614, dated Aug. 19, 2021, eight pages.

* cited by examiner

*Primary Examiner* — Daniel Whalen
(74) *Attorney, Agent, or Firm* — Fenwick & West LLP

(57) ABSTRACT

The disclosure relates to display panel and display apparatus including the same. The display panel includes a substrate including a display part displaying an image, an adhesive layer covering the display part, on the substrate, and a heat dissipation member on the adhesive layer. The heat dissipation member includes a first metal layer, a middle layer including an organic layer and a plurality of partition walls provided on the first metal layer, and a second metal layer provided on the middle layer.

20 Claims, 11 Drawing Sheets

DISPLAY PANEL COMPRISING HEAT DISSIPATION MEMBER AND DISPLAY APPARATUS INCLUDING THE SAME

CROSS-REFERENCE TO RELATED APPLICATIONS

This application is a continuation application of U.S. patent application Ser. No. 16/886,614 filed on May 28, 2020, which claims the benefit of Republic of Korea Patent Application No. 10-2019-0066221 filed on Jun. 4, 2019, all of which are hereby incorporated by reference as if fully set forth herein.

BACKGROUND

Field

The present disclosure relates to a display panel for displaying an image and a display apparatus including the display panel.

Discussion of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device have been widely utilized.

An OLED device out of such display devices employs a spontaneous emission system, has a viewing angle, a contrast ratio, and the like which are more excellent than those of an LCD device, and can be decreased in weight and thickness and is advantageous in power consumption because a separate backlight is not required. An OLED device can be driven with a DC low voltage, has a high response speed, and has low manufacturing costs.

OLED devices are easily damaged by an external cause such as water or oxygen flowing in from the outside or an impact applied thereto from the outside and an internal cause such as heat occurring therein.

SUMMARY

Accordingly, the present disclosure is directed to providing a display panel and a display apparatus including the same that substantially obviate one or more problems due to limitations and disadvantages of the related art.

An aspect of the present disclosure is directed to providing a display panel and a display apparatus including the same, which prevent damage caused by an external cause and an internal cause.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display panel including a substrate including a display part displaying an image, an adhesive layer covering the display part, on the substrate, and a heat dissipation member on the adhesive layer. The heat dissipation member includes a first metal layer, a middle layer including an organic layer and a plurality of partition walls provided on the first metal layer, and a second metal layer provided on the middle layer.

In another aspect of the present disclosure, there is provided a display apparatus including a display panel and a rear structure disposed on a rear surface of the display panel, wherein the display panel includes a display part displaying an image, an adhesive layer covering the display part, on the substrate, and a heat dissipation member on the adhesive layer. The heat dissipation member includes a first metal layer, a middle layer including an organic layer and a plurality of partition walls provided on the first metal layer, and a second metal layer provided on the middle layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
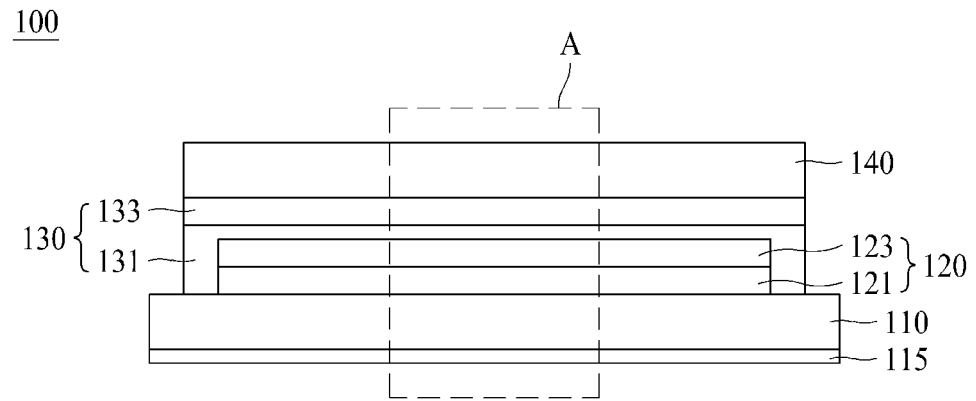
FIG. 1 is a cross-sectional view illustrating a display panel according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise,' 'have,' and 'include' described in the present disclosure are used, another part may be added unless 'only~' is used. The terms of a singular form may include plural forms unless referred to the contrary.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Terms such as first and second can be used to describe elements of the present disclosure. These terms are only used to distinguish one element from another element, and essentials, sequences, orders, or numbers of the elements are not limited by the terms. When an element is described as being "connected," "coupled," or "linked" to another element, it should be understood that the element may be connected or coupled directly to another element, still another element may be "interposed" between the elements, or the elements may be "connected," "coupled," or "linked" to each other via still another element.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or totally coupled to or combined with each other, and may be variously inter-operated and driven technically. The embodiments of the present disclosure may be carried out independently from each other or may be carried out together with a co-dependent relationship.

Reference will now be made in detail to the exemplary embodiments of the present disclosure, examples of which are illustrated in the accompanying drawings. Wherever possible, the same reference numbers will be used throughout the drawings to refer to the same or like parts.

Figure 2:
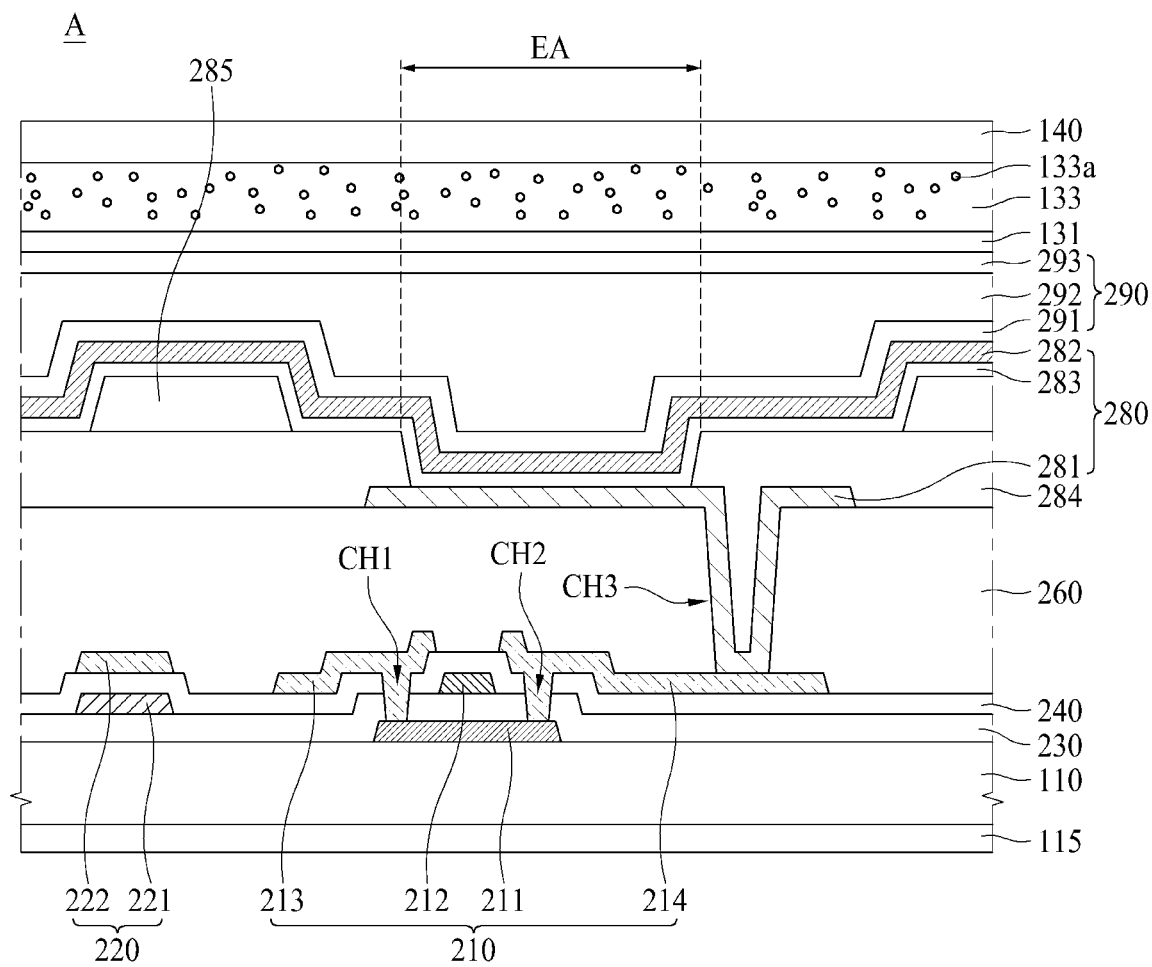
FIG. 2 is an enlarged view illustrating an example of a pixel of a region A of FIG. 1, according to an embodiment of the present disclosure.

FIG. 1 is a cross-sectional view illustrating a display panel according to an embodiment of the present disclosure. FIG. 2 is an enlarged view illustrating an example of a pixel of a region A of FIG. 1, according to an embodiment of the present disclosure.

Referring to FIGS. 1 and 2, a display panel 100 according to an embodiment of the present disclosure may include a substrate 110, a pixel array layer 120, an adhesive layer 130, and a heat dissipation member 140.

The display panel with built-in touch screen according to the embodiment of the present disclosure may be realized as a flat display panel such as a liquid crystal display panel, field emission display panel, plasma display panel, organic light emitting display panel, and electrophoresis display panel. Hereinafter, the display panel according to the embodiment of the present disclosure is realized as, but not limited to, an organic light emitting display panel.

The substrate 110 may be a base substrate and may be a plastic film, a glass substrate, or a silicon wafer substrate formed through a semiconductor process. The substrate 110 may include a transparent material, or may include an opaque material. For example, the substrate 110 may include a flexible material which is bendable or flexible, and for example, may include opaque or colored polyimide (PI). As another example, the substrate 110 may include a thin glass material having flexibility.

The substrate 110 may include a display part defined on one surface thereof and a non-display part surrounding the display part.

The pixel array layer 120 may include a plurality of pixels which are provided in the display part defined on the one surface of the substrate 110 to display an image. Each of the plurality of pixels may be a region of a minimum unit emitting real light and may be defined as a subpixel. At least three adjacent pixels may configure one unit pixel for displaying a color. For example, one unit pixel may include a red pixel, a green pixel, and a blue pixel which are adjacent to one another and may further include a white pixel for enhancing luminance.

The pixel array layer 120 according to an embodiment may include a pixel circuit layer 121 and a light emitting device layer 123.

The pixel circuit layer 121 may include a plurality of signal lines disposed on the substrate 110 and a pixel circuit provided in each of a plurality of pixel areas defined by the signal lines. The signal lines may include a gate line, a data line, and a pixel driving power line. The pixel circuit may include at least one capacitor and a plurality of thin film transistors (TFTs) connected to the signal lines.

The light emitting device layer 123 may be disposed in each of the pixel areas of the substrate 110 and may be electrically connected to a corresponding pixel circuit. The light emitting device layer 133 may have a bottom emission structure where light emitted from a light emitting device passes through the substrate 110 and is discharged to the outside, a top emission structure where the light emitted from the light emitting device passes through the heat dissipation member 140 and is discharged to the outside, and a dual emission structure.

Hereinafter, a structure of a pixel according to an embodiment of the present disclosure will be described in detail with reference to FIG. 2.

Referring to FIG. 2, the pixel circuit layer 121 may be provided on a first surface of the substrate 110. The pixel circuit layer 121 may include a plurality of TFTs 210 and a plurality of capacitors 220.

A buffer film is formed on the first surface of the substrate 110. The buffer film may be formed on the first surface of the substrate 110 to protect the TFTs 210 from water permeated through the substrate 110 which is vulnerable to moisture permeability.

The TFT 210 includes an active layer 211, a gate electrode 212, a source electrode 213, and a drain electrode 214. Although the TFT 210 is formed in a top gate mode in which the gate electrode 212 is arranged above the active layer 211 as shown in FIG. 2, it is to be understood that the TFT of the present disclosure is not limited to the top gate mode. That is, the TFT 210 may be formed in a bottom gate mode in which the gate electrode 212 is arranged below the active layer 211 or a double gate mode in which the gate electrode 212 is arranged above and below the active layer 211.

The active layer 211 may be provided on the buffer film. The active layer 211 may be formed of a silicon based semiconductor material or an oxide based semiconductor material. A light-shielding layer for shielding external light entering the active layer 211 may be formed between the buffer film and the active layer 211.

The gate insulating film 230 may be provided on the active layer 211. The gate insulating film 230 may be formed of an inorganic film, for example, a silicon oxide film (SiOx), a silicon nitride film (SiNx) or a multi-layered film of the silicon oxide film and the silicon nitride film.

The gate electrode 212 and the gate line may be provided on the gate insulating film 230. The gate electrode 212 and the gate line may be formed of a single layer or multi-layer comprised of any one of Mo, Al, Cr, Au, Ti, Ni, Nd and Cu or their alloy.

The inter-layer dielectric film 240 may be provided on the gate electrode 212. The inter-layer dielectric film 240 may be formed of an inorganic film, for example, a silicon oxide film (SiOx), a silicon nitride film (SiNx), or a multi-layered film of the silicon oxide film and the silicon nitride film.

The source electrode 213, the drain electrode 214, and data line may be provided on the inter-layer dielectric film 240. Each of the source electrode 213 and the drain electrode 214 may be connected to the active layer 211 through a contact hole that passes through the gate insulating film 230 and the inter-layer dielectric film 240. The source electrode 213, the drain electrode 214, and data line may be formed of a single layer or multi-layer comprised of any one of Mo, Al, Cr, Au, Ti, Ni, Nd and Cu or their alloy.

The capacitor 220 includes a lower electrode 221 and an upper electrode 222. The lower electrode 221 may be provided on the gate insulating film 230, and may be formed of the same material as the gate electrode 212. The upper electrode 222 may be provided on the inter-layer dielectric film 240, and may be formed of the same material as the source electrode 213 and the drain electrode 214.

A passivation layer may be provided on the TFTs 210 and the capacitors 220. The passivation layer may act as an insulation layer. The passivation layer may be formed of an inorganic layer, and for example, may be formed of silicon oxide, silicon nitride, or a multilayer thereof. The passivation layer may be omitted.

A planarization layer 260 for planarizing a step height caused by the TFT 210 and the capacitor 220 may be provided on the passivation layer. The planarization layer 260 may be formed of an organic layer such as acryl resin, epoxy resin, phenolic resin, polyamide resin, or polyimide resin.

The light emitting device layer 123 may be provided on one surface of the planarization layer 260. The light emitting device layer 123 may include an organic light emitting device 280, a bank 284, and a spacer 285. The organic light emitting device 280 may include a second electrode 282, an organic light emitting layer 283, and a first electrode 281. The second electrode 282 may be a cathode electrode, and the first electrode 281 may be an anode electrode. An area, where the second electrode 282, the organic light emitting layer 283, and the first electrode 281 are stacked, may be defined as an emission area EA.

The first electrode 281 may be provided on the planarization layer 260. The first electrode 281 may be connected to a drain electrode 214 of the TFT 210 through a contact hole CH3 passing through the passivation layer and the planarization layer 260.

In the bottom emission structure or the dual emission structure, the first electrode 281 may include a transparent conductive material (TCO), such as indium tin oxide (ITO) or indium zinc oxide (IZO), or a semi-transmissive conductive material such as magnesium (Mg), silver (Ag), or an alloy of Mg and Ag, which transmit light. In the top emission structure, the first electrode 281 may include a metal material, which is high in reflectance, such as a stacked structure (titanium/aluminum/titanium (Ti/Al/Ti)) of Al and Ti, a stacked structure (ITO/Al/ITO) of Al and ITO, an APC alloy, and a stacked structure (ITO/APC/ITO) of an APC alloy and ITO.

The bank 284 may be provided on the planarization layer 260 to cover an edge of the first electrode 281, for dividing a plurality emission parts EA. The bank 284 may be formed of an organic layer such as acryl resin, epoxy resin, phenolic resin, polyamide resin, or polyimide resin.

The spacer 285 may be provided on the bank 284. The spacer 285 may be formed of an organic layer such as acryl resin, epoxy resin, phenolic resin, polyamide resin, or polyimide resin. The spacer 285 may be omitted.

The organic light emitting layer 283 may be provided on the first electrode 281, the bank 284, and the spacer 285. The organic light emitting layer 283 may include a hole transporting layer, at least one light emitting layer, and an electron transporting layer. In this case, when a voltage is applied to the first electrode 281 and the second electrode 282, a hole and an electron may move to the light emitting layer through the hole transporting layer and the electron transporting layer and may be combined in the light emitting layer to emit light.

The organic light emitting layer 283 may include a white light emitting layer emitting white light. In this case, the organic light emitting layer 283 may be provided to cover the first electrode 281 and the bank 284.

Alternatively, the organic light emitting layer 283 may include a red light emitting layer emitting red light, a green light emitting layer emitting green light, or a blue light emitting layer emitting blue light. In this case, the organic light emitting layer 283 may be provided in a region corresponding to the first electrode 281.

The second electrode 282 may be provided on the organic light emitting layer 283. In the bottom emission structure or the dual emission structure, the second electrode 282 may include a metal material, which is high in reflectance, such as a stacked structure (Ti/Al/Ti) of Al and Ti, a stacked structure (ITO/Al/ITO) of Al and ITO, an APC alloy, and a stacked structure (ITO/APC/ITO) of an APC alloy and ITO. In the top emission structure, the second electrode 282 may include a transparent conductive material (TCO), such as ITO or IZO, or a semi-transmissive conductive material such as Mg, Ag, or an alloy of Mg and Ag, which transmit light. A capping layer may be provided on the second electrode 282.

The light emitting device layer 123 may further include an encapsulation layer 290 provided on the organic light emitting device 280. The encapsulation layer 290 may be provided to surround the organic light emitting device 280. The encapsulation layer 290 according to an embodiment may be provided in a multi-layer structure where an organic material layer and an inorganic material layer are alternately stacked. The inorganic material layer may block penetration of oxygen or water into the organic light emitting device 280. The organic material layer may be provided to have a thickness which is relatively thicker than that of the inorganic material layer, so as to sufficiently cover particles occurring in a manufacturing process.

For example, the encapsulation layer 290 may include a first inorganic material layer 291 surrounding the organic light emitting device 280, an organic material layer 292 surrounding the first inorganic material layer 291, and a second inorganic material layer 293 surrounding the organic material layer 292. Each of the first and second inorganic material layers 291 and 293 may include a material such as nitride silicon (SiNx), oxide silicon (SiOx), oxynitride silicon (SiON), or oxide aluminum (AlxOy). The organic material layer 292 may include one material among acryl resin, epoxy resin, phenolic resin, polyamide resin, polyimide resin, benzocyclobutene resin, and fluorine resin, but is not limited thereto.

The adhesive layer 130 may be provided on the light emitting device layer 123 to cover the light emitting device layer 123 and may block penetration of oxygen or water into the light emitting device layer 123. Also, the adhesive layer 130 may couple the heat dissipation member 140 to the substrate 110 with the light emitting device layer 123 provided thereon.

The adhesive layer 130 may include a first layer 131 and a second layer 133. The first layer 131 may be provided on the substrate 110 with the light emitting device layer 123 provided thereon, and one surface thereof may be bonded to the light emitting device layer 123. The first layer 131 may decrease pressure which is applied thereto in bonding the heat dissipation member 140 to the substrate 110 with the light emitting device layer 123 provided thereon.

The first layer 131 may be referred to as a transparent layer (a T-layer), but is not limited thereto. The first layer 131 may include transparent curable resin. For example, the first layer 131 may include an adhesive material such as epoxy, acryl, silicon, or urethane.

The second layer 133 may be provided on the first layer 131, and one surface thereof may be adhered to the first layer 131. The other surface of the second layer 133 facing the one surface may be adhered to the heat dissipation member 140.

The second layer 133 may be referred to as a barrier layer (a B-layer), but is not limited thereto. The second layer 133 may include transparent curable resin. For example, the first layer 131 and the second layer 133 may include the same material (for example, curable resin). The first layer 131 and the second layer 133 may include an adhesive material such as epoxy, acryl, silicon, or urethane. According to another embodiment, the first layer 131 and the second layer 133 may include different materials (for example, different curable resins). The first layer 131 and the second layer 133 may respectively include different materials among epoxy, acryl, silicon, or urethane.

Moreover, the second layer 133 may further include an adsorbing material 133a for adsorbing water or oxygen. The adsorbing material 133a of the second layer 133 may adsorb or remove water or oxygen flowing in from the outside, based on a physical or chemical reaction. For example, the adsorbing material 133a may be a getter material, but is not limited thereto.

The second layer 133 may block penetration of water or oxygen through a side surface to protect a light emitting device from water or oxygen, thereby preventing a lifetime of the light emitting device from being reduced by water or oxygen and increasing the reliability of the light emitting device.

The heat dissipation member 140 may be adhered to the substrate 110 with the pixel array layer 120 provided thereon by using the adhesive layer 130. The heat dissipation member 140 may dissipate heat occurring in the pixel array layer 120. Furthermore, the heat dissipation member 140 according to an embodiment of the present disclosure may protect the pixel array layer 120 from an external impact and may primarily block penetration of water or oxygen into the pixel array layer 120. The heat dissipation member will be described below in detail with reference to FIGS. 3 to 8.

The display panel 100 according to an embodiment of the present disclosure may further include a functional film 115. The functional film 115 may be disposed on the substrate 110, and in this case, the display panel 100 may have the bottom emission structure or the dual emission structure. For example, the functional film 115 may be attached on the other surface opposite to one surface of the substrate 110. The functional film 115 according to an embodiment may be attached on a front surface of the substrate 110 by using a film attachment member. For example, the film attachment member may include a pressure sensitive adhesive (PSA), an optical clear adhesive (OCA), or an optical clear resin (OCR).

The functional film 115 according to an embodiment may include an anti-reflection layer (or an anti-reflection film) for preventing reflection of external light to enhance outdoor visibility and a contrast ratio with respect to an image displayed by the display panel 100. For example, the anti-reflection layer may include a circular polarization layer (or a circular polarization film) which prevents external light incident through the substrate 110 from being reflected by TFTs and lines disposed on the pixel array layer 120 to again travel to the substrate 110.

The functional film 115 according to an embodiment may further include a barrier layer (or a barrier film) for primarily preventing penetration of water or oxygen, and the barrier layer may include a material (for example, a polymer material) which is low in water vapor transmission rate.

Moreover, the functional film 115 may further include a light path control layer (or a light path control film) for controlling a path of light output from the pixel array layer 120 to the substrate 110. The light path control layer may include a stacked structure where a high refraction layer and a low refraction layer are alternately stacked, and thus, may change a path of light incident from the pixel array layer 120 to minimize a color shift based on a viewing angle.

Optionally, when the display panel 100 has the top emission structure or the dual emission structure, the functional film 115 may be disposed on a front surface of the heat dissipation member 140 by using a film attachment member.

Hereinafter, a heat dissipation member according to an embodiment of the present disclosure will be described in detail with reference to FIGS. 3 to 10.

Figure 3:
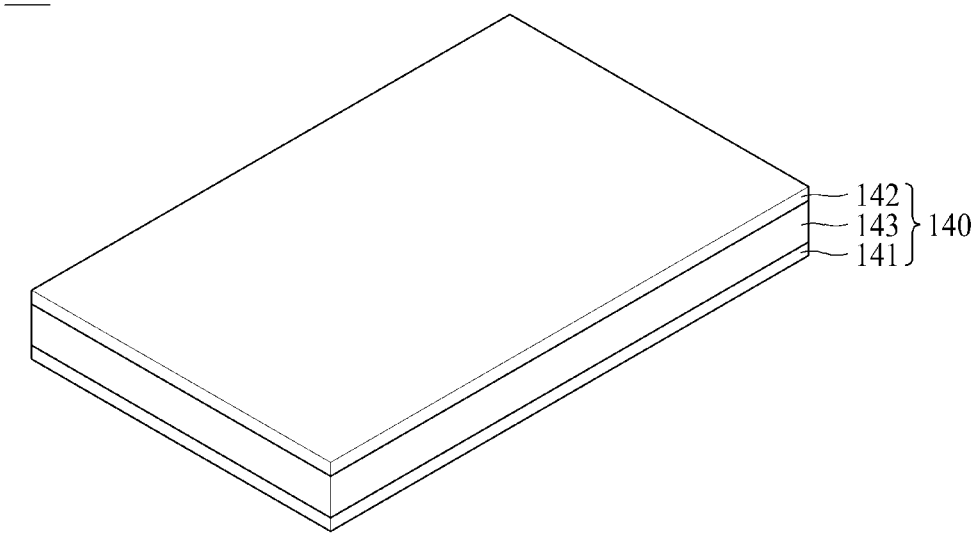
FIG. 3 is a perspective view illustrating a heat dissipation member of FIG. 1, according to an embodiment of the present disclosure.
Figure 4:
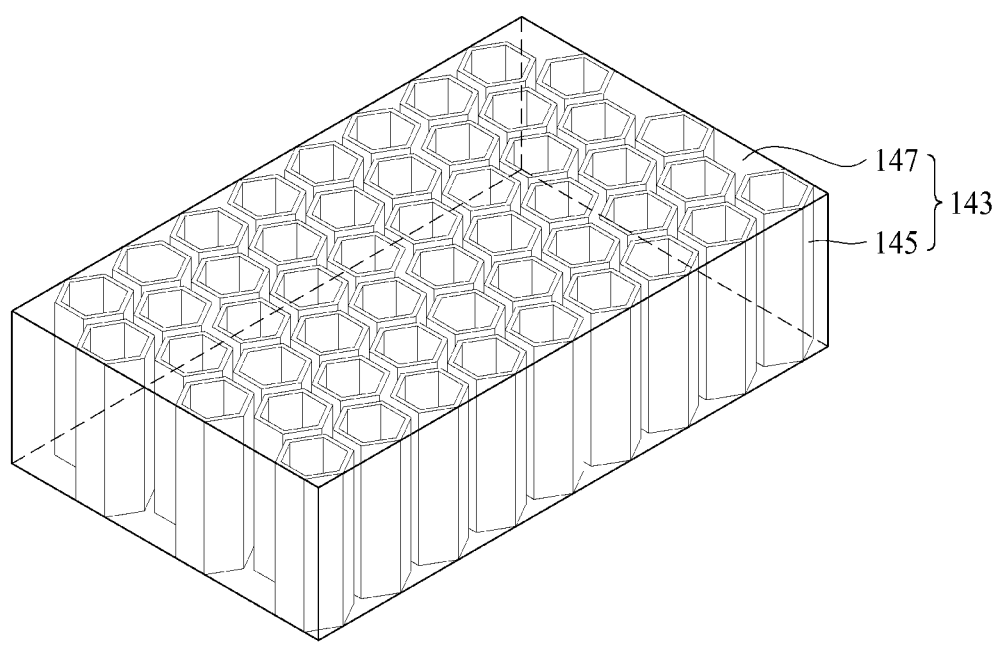
FIG. 4 is a perspective view illustrating a middle layer of FIG. 3, according to an embodiment of the present disclosure.

FIG. 3 is a perspective view illustrating the heat dissipation member of FIG. 1, FIG. 4 is a perspective view illustrating a middle layer of FIG. 3, and FIG. 5 is a plan view illustrating various embodiments of a plurality of partition walls illustrated in FIG. 4.

Referring to FIGS. 3 to 5, the heat dissipation member 140 may include a first metal layer 141, a second metal layer 142, and a middle layer 143.

The first metal layer 141 may be provided on the pixel array layer 120 with the adhesive layer 130 therebetween. The first metal layer 141 may receive heat, through the adhesive layer 130, occurring in the pixel array layer 120, and may transfer the received heat to the middle layer 143.

The first metal layer 141 may be disposed to correspond to a region, where the pixel array layer 120 is provided, or to cover the region where the pixel array layer 120 is provided. The first metal layer 141 may be disposed to have a wide area and may efficiently receive heat occurring in the pixel array layer 120.

The first metal layer 141 may include a metal material having high thermal conductivity. For example, the first metal layer 141 may include one material among stainless steel, Al, copper (Cu), Ag, a Mg alloy, a magnesium-lithium (Mg—Li) alloy, and an Al alloy, but is not limited thereto.

The first metal layer 141 may be provided to have a thin thickness. The first metal layer 141 may be thickly provided for increasing heat dissipation performance. However, when the first metal layer 141 is provided to be thick, the first metal layer 141 may increase in weight. Therefore, a region disposed inward from an edge of the first metal layer 141 may be sagged, and an edge region of the first metal layer 141 may protrude upward. In this case, the edge region of the first metal layer 141 may not contact the adhesive layer 130 and a gap therebetween may be opened, and due to this, oxygen or water may penetrate through the opened gap to damage the pixel array layer 120. In order to prevent such damage, the heat dissipation member 140 according to an embodiment of the present disclosure may be thinly provided so that the first metal layer 141 is not sagged.

The middle layer 143 may be provided between the first metal layer 141 and the second metal layer 142. The middle layer 143 may maintain an interval between the first metal layer 141 and the second metal layer 142 and may transfer heat from the first metal layer 141 to the second metal layer 142.

The middle layer 143 may include a plurality of partition walls 145 and an organic layer 147. The plurality of partition walls 145 may be arranged at certain intervals between the first metal layer 141 and the second metal layer 142 and may maintain the interval between the first metal layer 141 and the second metal layer 142. The plurality of partition walls 145 may prevent the heat dissipation member 140 from being deformed despite an external impact applied from the outside, and thus, may protect the pixel array layer 120 from the external impact.

Moreover, the plurality of partition walls 145 may receive heat, occurring in the pixel array layer 120, from the first metal layer 141 and may transfer the received heat to the second metal layer 142.

The plurality of partition walls 145 may include a metal material having high stiffness and high thermal conductivity, but is not limited thereto. For example, the plurality of partition walls 145 may include one material among stainless steel, Al, Cu, Ag, a Mg alloy, a Mg—Li alloy, and an Al alloy, but is not limited thereto.

The plurality of partition walls 145 may include the same material as that of at least one of the first metal layer 141 and the second metal layer 142, but is not limited thereto. The plurality of partition walls 145 may include a material which differs from that of each of the first metal layer 141 and the second metal layer 142.

As described above, the plurality of partition walls 145 may include a metal material having high stiffness and high thermal conductivity, thereby securing the stiffness of the heat dissipation member 140 and enhancing heat dissipation performance thereof.

According to another embodiment, the plurality of partition walls 145 may include a plastic material having high stiffness, for securing only stiffness. Since the plurality of partition walls 145 include the plastic material, the stiffness of the heat dissipation member 140 may be secured, and moreover, an increase in weight of the heat dissipation member 140 may be prevented.

Each of the plurality of partition walls 145 may be provided to have a pattern having a height which is equal to or less than a separation distance between the first metal layer 141 and the second metal layer 142. Each of the plurality of partition walls 145 may have a hexagonal pattern where a space is formed therein as illustrated in FIG. 4, but is not limited thereto. The plurality of partition walls 145 may be provided to have various patterns as illustrated in FIG. 5.

Figure 5G:
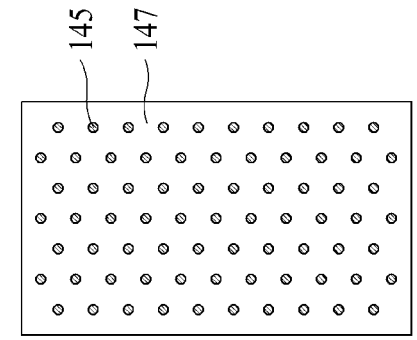
FIGS. 5A to 5G are plan views illustrating various embodiments of a plurality of partition walls illustrated in FIG. 4.
Figure 5E:
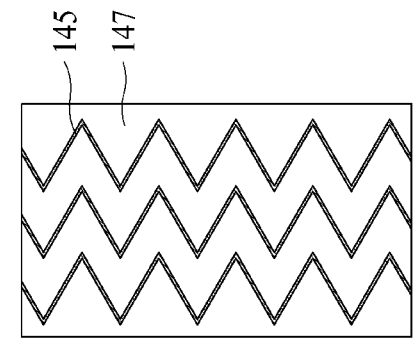
Figure 5F:
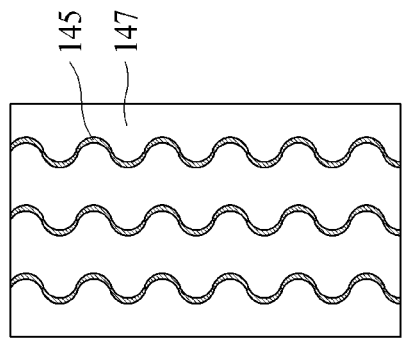
Figure 5C:
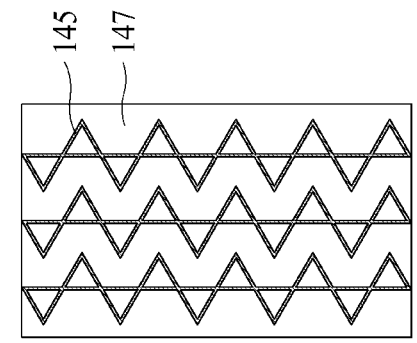
Figure 5D:
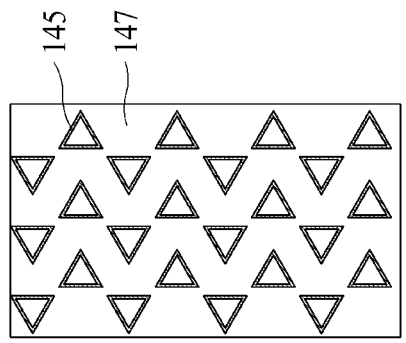
Figure 5A:
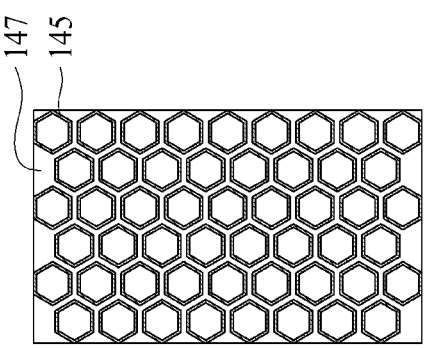

Each of the plurality of partition walls 145 according to an embodiment may have a hexagonal pattern as illustrated in FIG. 5A and may be apart from adjacent partition walls 145.

Figure 5B:
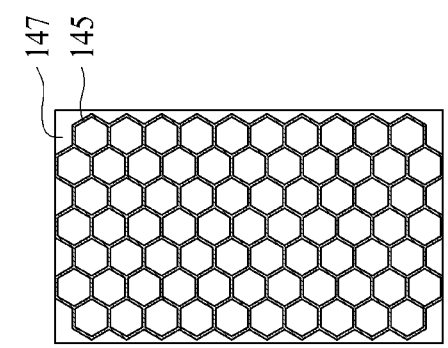

According to another embodiment, each of the plurality of partition walls 145 may has a hexagonal pattern as illustrated in FIG. 5B and may be connected to adjacent partition walls 145. In this case, comparing partition walls illustrated in FIG. 5A, the plurality of partition walls 145 may decrease in area thereof, and thus, the weight of the heat dissipation member 140 may be reduced.

According to another embodiment, the plurality of partition walls 145 may be provided to have a polygonal pattern which differs from that of each of partition walls illustrated in FIGS. 5A and 5B. For example, the plurality of partition walls 145 may have a triangular pattern where a space is formed therein as illustrated in FIG. 5C and may be connected to adjacent partition walls 145. As another example, the plurality of partition walls 145 may have a triangular pattern where a space is formed therein as illustrated in FIG. 5D and may be apart from adjacent partition walls 145.

According to another embodiment, the plurality of partition walls 145 may be provided to have a line-shaped pattern which differs from that of each of partition walls illustrated in FIGS. 5A to 5D. For example, the plurality of partition walls 145 may have a zigzag line pattern as illustrated in FIG. 5E and may be apart from adjacent partition walls 145. As another example, the plurality of partition walls 145 may have a wave line pattern as illustrated in FIG. 5F and may be apart from adjacent partition walls 145.

According to another embodiment, the plurality of partition walls 145 may be provided to have a polygonal or circular pattern where a space is not formed therein, unlike partition walls illustrated in FIGS. 5A to 5D. For example, the plurality of partition walls 145 may have a circular pattern where a space is not formed therein as illustrated in FIG. 5G and may be apart from adjacent partition walls 145. The plurality of partition walls 145 illustrated in FIG. 5G may have a circular pillar shape.

The organic layer 147 may be provided to fill a space which is formed between the first metal layer 141 and the second metal layer 142 by the plurality of partition walls 145. The organic layer 147 may include one material among acryl resin, epoxy resin, phenolic resin, polyamide resin, polyimide resin, benzocyclobutene resin, and fluorine resin, but is not limited thereto.

The second metal layer 142 may be provided to face the first metal layer 141 with the middle layer 143 therebetween. The second metal layer 142 may receive heat, occurring in the pixel array layer 120, through the first metal layer 141 and the middle layer 143 and may transfer the received heat to the outside.

The second metal layer 142 may be disposed to correspond to a region, where the pixel array layer 120 is provided, or to cover the region where the pixel array layer 120 is provided. The second metal layer 142 may be disposed to have a wide area and may efficiently receive heat occurring in the pixel array layer 120.

The second metal layer 142 may include a metal material having high thermal conductivity. For example, the second metal layer 142 may include one material among stainless steel, Al, Cu, Ag, a Mg alloy, a Mg—Li alloy, and an Al alloy, but is not limited thereto.

The second metal layer 142 may include the same material as that of the first metal layer 141, but is not limited thereto. The second metal layer 142 may include a material which differs from that of the first metal layer 141.

The second metal layer 142 may be provided to have a thin thickness. The second metal layer 142 may be thickly provided for increasing heat dissipation performance. However, when the second metal layer 142 is provided to be thick, the second metal layer 142 may increase in weight. Therefore, a region disposed inward from an edge of the second metal layer 142 may be sagged, and an edge region of the second metal layer 142 may protrude upward. In this case, a gap between the second metal layer 142 and the middle layer 145 may be opened in the edge region of the second metal layer 142, and due to this, oxygen or water may penetrate through the opened gap to damage the pixel array layer 120. In order to prevent such damage, the heat dissipation member 140 according to an embodiment of the present disclosure may be thinly provided so that the second metal layer 142 is not sagged.

The display panel 100 according to an embodiment of the present disclosure may be characterized by including the heat dissipation member 140 including the first metal layer 141, the second metal layer 142, and the middle layer 143. In the heat dissipation member 140 according to an embodiment of the present disclosure, the first metal layer 141 and the second metal layer 142 may include a metal material having high thermal conductivity. Accordingly, the heat dissipation member 140 according to an embodiment of the present disclosure may dissipate heat, occurring in the pixel array layer 120, to the outside.

Moreover, in the heat dissipation member 140 according to an embodiment of the present disclosure, the first metal layer 141 and the second metal layer 142 may be formed to have a thin thickness, and thus, the heat dissipation member 140 according to an embodiment of the present disclosure may prevent the first metal layer 141 and the second metal layer 142 from being sagged by weight, thereby preventing a gap from occurring in a side surface. Accordingly, the heat dissipation member 140 according to an embodiment of the present disclosure may prevent the pixel array layer 120 from being damaged by oxygen or water penetrating through the gap.

Moreover, the heat dissipation member 140 according to an embodiment of the present disclosure may include the middle layer 143 disposed between the first metal layer 141 and the second metal layer 142. The middle layer 143 of the heat dissipation member 140 may include the plurality of heat dissipation walls 145 and the organic layer 147. The heat dissipation member 140 according to an embodiment of the present disclosure may include the plurality of partition walls 145 including a material having high stiffness, thereby securing stiffness. Furthermore, in the heat dissipation member 140 according to an embodiment of the present disclosure, the plurality of partition walls 145 may include a material having high thermal conductivity, thereby enhancing heat dissipation performance.

Moreover, in the heat dissipation member 140 according to an embodiment of the present disclosure, a space formed by the plurality of partition walls 145 may be filled with the organic layer 147 which is light in weight. Accordingly, the heat dissipation member 140 according to an embodiment of the present disclosure may secure stiffness without a large increase in weight, thereby enhancing heat dissipation performance.

Moreover, by using one heat dissipation member 140, the display panel 100 according to an embodiment of the present disclosure may dissipate heat, occurring in the pixel array layer 120, to the outside and may secure stiffness. Accordingly, the display panel 100 according to an embodiment of the present disclosure may decrease a total thickness compared to a related art display panel which separately includes a first member for stiffness and a second member for dissipating heat.

Moreover, in the related art display panel which separately includes the first member for stiffness and the second member for dissipating heat, an air gap may occur due to a step height occurring between the first member and the second member. In this case, heat occurring in a pixel array layer may not be transferred to the outside due to the air gap, causing a reduction in heat dissipation performance. Also, there may be a problem where oxygen or water penetrates into the air gap. Since the display panel 100 according to an embodiment of the present disclosure uses one heat dissipation member 140, an air gap may not occur. Accordingly, the display panel 100 according to an embodiment of the present disclosure may prevent heat dissipation performance from being reduced by the air gap or may prevent oxygen or water from penetrating into the air gap.

The plurality of partition walls 145 illustrated in FIGS. 4 and 5 may include one material, but are not limited thereto. The plurality of partition walls 145 may include different materials. This will be described below in detail with reference to FIGS. 6 to 9.

Figure 6:
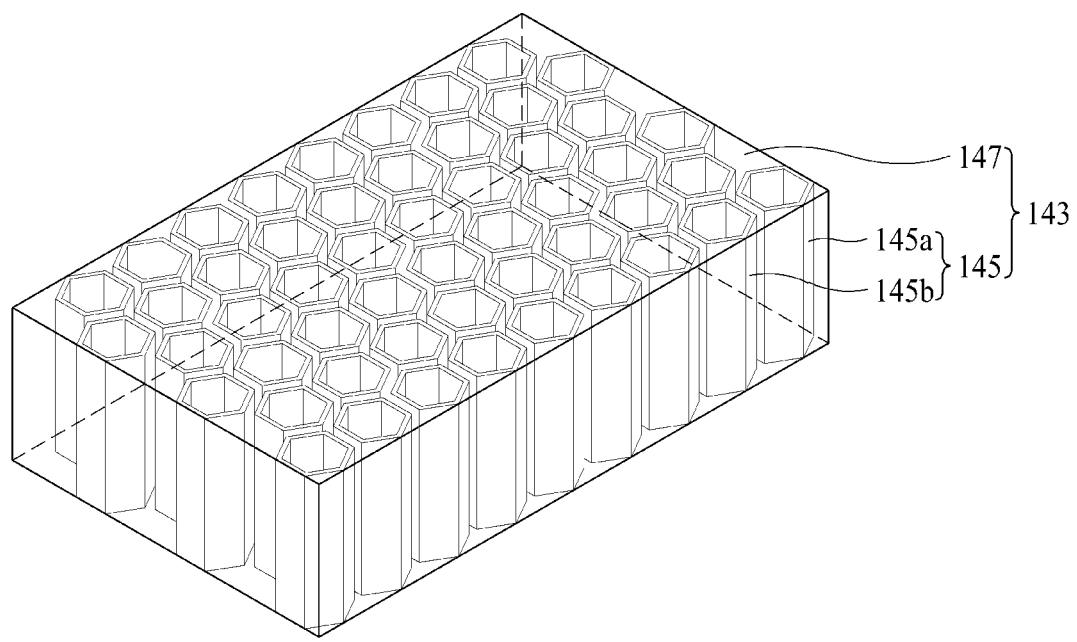
FIG. 6 is a perspective view illustrating a modified embodiment of a middle layer illustrated in FIG. 4.

FIG. 6 is a perspective view illustrating a modified embodiment of the middle layer illustrated in FIG. 4, according to one embodiment of the present disclosure, and FIGS. 7A to 7E are plan views illustrating various embodiments of a plurality of partition walls illustrated in FIG. 6.

Referring to FIGS. 6 and 7, the middle layer 143 may be provided between the first metal layer 141 and the second metal layer 142. The middle layer 143 may maintain an interval between the first metal layer 141 and the second metal layer 142 and may transfer heat from the first metal layer 141 to the second metal layer 142.

The middle layer 143 may include a plurality of first partition walls 145a, a plurality of second partition walls 145b, and an organic layer 147. The plurality of first partition walls 145a and the plurality of second partition walls 145b may be alternately arranged at certain intervals between the first metal layer 141 and the second metal layer 142. The plurality of first partition walls 145a and the plurality of second partition walls 145b may maintain an interval between the first metal layer 141 and the second metal layer 142. The plurality of first partition walls 145a and the plurality of second partition walls 145b may prevent the heat dissipation member 140 from being deformed despite an external impact applied from the outside, thereby protecting the pixel array layer 120 from an external impact.

The plurality of first partition walls 145a may include a first material, and the plurality of second partition walls 145b may include a second material which differs from the first material. Each of the first material and the second material may be one of a first metal material, a second metal material, and a plastic material.

The first metal material may include a metal material having high stiffness and high thermal conductivity. For example, the first metal material may include one material among stainless steel, Al, Cu, Ag, a Mg alloy, a Mg—Li alloy, and an Al alloy, but is not limited thereto.

The second metal material may be a metal material having high stiffness and high magnetism. For example, the second metal material may include one of iron (Fe), nickel (Ni), and cobalt (Co), but is not limited thereto.

The plurality of partition walls 145 according to an embodiment may include the plurality of first partition walls 145a including the first metal material and the plurality of second partition walls 145b including the second metal material. In this case, the plurality of first partition walls 145a may include the same material as that of at least one of the first metal layer 141 and the second metal layer 142, but are not limited thereto. The plurality of first partition walls 145a may include a material which differs from that of at least one of the first metal layer 141 and the second metal layer 142.

The plurality of first partition walls 145a may include a metal material having high stiffness and high thermal conductivity, thereby securing the stiffness of the heat dissipation member 140 and enhancing heat dissipation performance thereof. Also, the plurality of second partition walls 145b may include the second metal material having high stiffness and high magnetism, thereby securing the stiffness of the heat dissipation member 140 and enhancing magnetism thereof. The display panel 100 according to an embodiment of the present disclosure may easily move between a plurality of processes by using the magnetism of the heat dissipation member 140.

According to another embodiment, the plurality of partition walls 145 may include the plurality of first partition walls 145a including the first metal material and the plurality of second partition walls 145b including the plastic material. In this case, the plurality of first partition walls 145a may include the same material as that of at least one of the first metal layer 141 and the second metal layer 142, but are not limited thereto. The plurality of first partition walls 145a may include a material which differs from that of each of the first metal layer 141 and the second metal layer 142.

The plurality of first partition walls 145a may include a metal material having high stiffness and high thermal conductivity, thereby securing the stiffness of the heat dissipation member 140 and enhancing heat dissipation performance thereof. Also, the plurality of second partition walls 145b may include a plastic material which is relatively light in weight, compared to the first metal material, thereby securing the stiffness of the heat dissipation member 140 and minimizing or reducing an increase in weight of the heat dissipation member 140.

Each of the plurality of first partition walls 145a and the plurality of second partition walls 145b may be provided to have a pattern having a height which is equal to or less than a separation distance between the first metal layer 141 and the second metal layer 142. Each of the plurality of first partition walls 145a and the plurality of second partition walls 145b may have a hexagonal shape where a space is formed therein as illustrated in FIG. 6, but is not limited thereto. The plurality of first partition walls 145a and the plurality of second partition walls 145b may be provided to have various patterns as illustrated in FIG. 7.

Figure 7A:
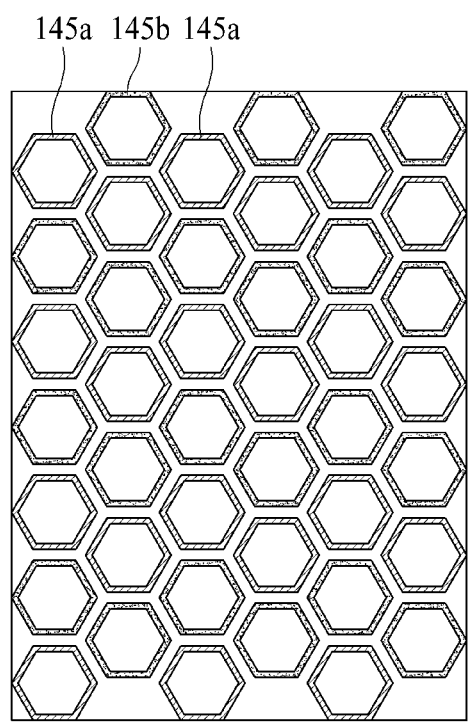
FIGS. 7A to 7E are plan views illustrating various embodiments of a plurality of partition walls illustrated in FIG. 6.

Each of the plurality of first partition walls 145a according to an embodiment may have a hexagonal pattern as illustrated in FIG. 7A and may be apart from adjacent first partition walls 145a or second partition walls 145b. The plurality of first partition walls 145a and the plurality of second partition walls 145b may be alternately arranged in a horizontal direction. The plurality of second partition walls 145b may have a hexagonal pattern like the plurality of first partition walls 145a and may be apart from adjacent first partition walls 145a or second partition walls 145b.

Figure 7B:
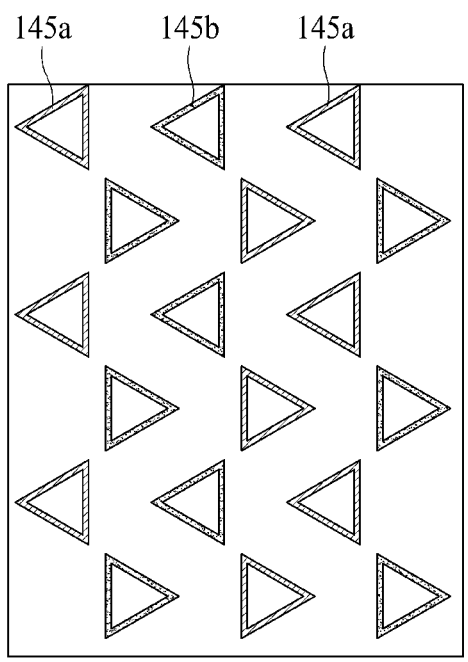

According to another embodiment, the plurality of first partition walls 145a and the plurality of second partition walls 145b may be provided to have a polygonal pattern which differs from that of the partition walls illustrated in FIG. 7A. For example, the plurality of first partition walls 145a may have a triangular pattern where a space is formed therein as illustrated in FIG. 7B and may be apart from adjacent first partition walls 145a or second partition walls 145b. The plurality of first partition walls 145a and the plurality of second partition walls 145b may be alternately arranged in a horizontal direction. The plurality of second partition walls 145b may have a triangular pattern like the plurality of first partition walls 145a and may be apart from adjacent first partition walls 145a or second partition walls 145b.

Figure 7C:
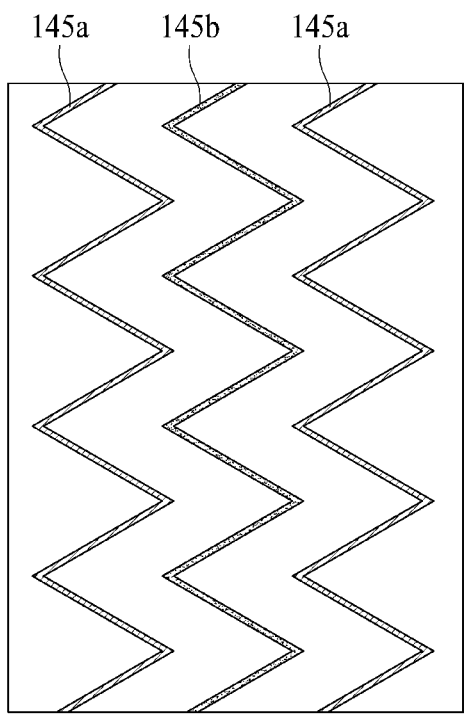
Figure 7D:
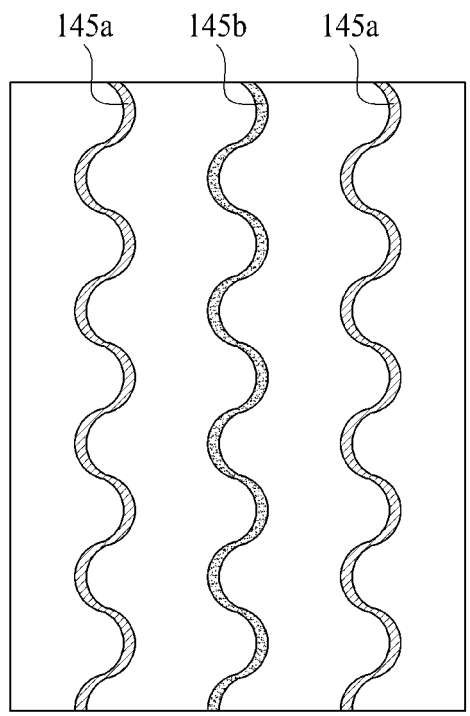

According to another embodiment, the plurality of first partition walls 145a and the plurality of second partition walls 145b may be provided to have a line-shaped pattern unlike the partition walls illustrated in FIGS. 7A and 7B. For example, the plurality of first partition walls 145a may have a zigzag line pattern as illustrated in FIG. 7C and may be apart from adjacent second partition walls 145b. The plurality of first partition walls 145a and the plurality of second partition walls 145b may be alternately arranged in a horizontal direction. The plurality of second partition walls 145b may have a zigzag line pattern like the first partition walls 145a and may be apart from adjacent first partition walls 145a. As another example, the plurality of first partition walls 145a may have a wave line pattern as illustrated in FIG. 7D and may be apart from adjacent second partition walls 145b. The plurality of first partition walls 145a and the plurality of second partition walls 145b may be alternately arranged in a horizontal direction. The plurality of second partition walls 145b may have a wave line pattern like the first partition walls 145a and may be apart from adjacent first partition walls 145a.

Figure 7E:
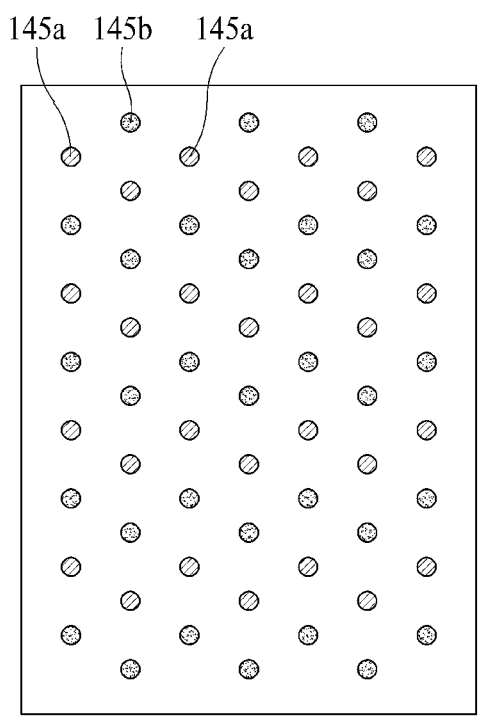

According to another embodiment, the plurality of first partition walls 145a and the plurality of second partition walls 145b may be provided to have a polygonal or circular pattern where a space is not formed therein, unlike the partition walls illustrated in FIGS. 7A and 7B. For example, the plurality of first partition walls 145a may be provided to have a circular pattern where a space is not formed therein as illustrated in FIG. 7E and may be apart from adjacent first partition walls 145a or second partition walls 145b. The plurality of first partition walls 145a and the plurality of second partition walls 145b may be alternately arranged in a horizontal direction. The plurality of second partition walls 145b may be provided to have a circular pattern where a space is not formed therein, like the first partition walls 145a, and may be apart from adjacent first partition walls 145a or second partition walls 145b. The plurality of first partition walls 145a and the plurality of second partition walls 145b illustrated in FIG. 7E may have a circular pillar shape.

The organic layer 147 may be provided to fill a space which is formed between the first metal layer 141 and the second metal layer 142 by the plurality of first partition walls 145a and the plurality of second partition walls 145b. The organic layer 147 may include one material among acryl resin, epoxy resin, phenolic resin, polyamide resin, polyimide resin, benzocyclobutene resin, and fluorine resin, but is not limited thereto.

Figure 8:
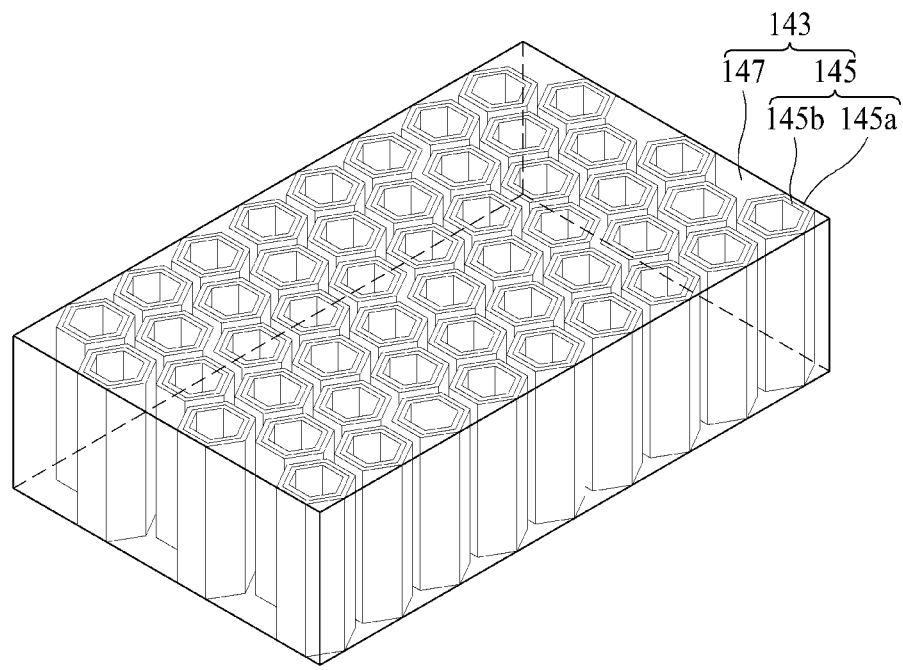
FIG. 8 is a perspective view illustrating another modified embodiment of the middle layer illustrated in FIG. 4.

FIG. 8 is a perspective view illustrating another modified embodiment of the middle layer illustrated in FIG. 4, and FIGS. 9A to 9E are plan views illustrating various embodiments of a plurality of partition walls illustrated in FIG. 8.

Referring to FIGS. 8 and 9, a middle layer 143 may be provided between a first metal layer 141 and a second metal layer 142. The middle layer 143 may maintain an interval between the first metal layer 141 and the second metal layer 142 and may transfer heat from the first metal layer 141 to the second metal layer 142.

The middle layer 143 may include a plurality of partition walls 145 and an organic layer 147. The plurality of partition walls 145 may be arranged at certain intervals between the first metal layer 141 and the second metal layer 142 and may maintain the interval between the first metal layer 141 and the second metal layer 142. The plurality of partition walls 145 may prevent the heat dissipation member 140 from being deformed despite an external impact applied from the outside, and thus, may protect the pixel array layer 120 from the external impact.

Moreover, each of the plurality of partition walls 145 may include a first partition wall 145a and a second partition wall 145b. In this case, the first partition wall 145a may be provided to surround a side surface of the second partition wall 145b.

The plurality of first partition walls 145a may include a first material, and the plurality of second partition walls 145b may include a second material which differs from the first material. Each of the first material and the second material may be one of a first metal material, a second metal material, and a plastic material.

The first metal material may include a metal material having high stiffness and high thermal conductivity. For example, the first metal material may include one material among stainless steel, Al, Cu, Ag, a Mg alloy, a Mg—Li alloy, and an Al alloy, but is not limited thereto.

The second metal material may be a metal material having high stiffness and high magnetism. For example, the second metal material may include one of Fe, Ni, and Co, but is not limited thereto.

The plurality of partition walls 145 according to an embodiment may include the plurality of first partition walls 145a including the first metal material and the plurality of second partition walls 145b including the second metal material. In this case, the plurality of first partition walls 145a may include the same material as that of at least one of the first metal layer 141 and the second metal layer 142, but are not limited thereto. The plurality of first partition walls 145a may include a material which differs from that of each of the first metal layer 141 and the second metal layer 142.

The plurality of first partition walls 145a may include a metal material having high stiffness and high thermal conductivity, thereby securing the stiffness of the heat dissipation member 140 and enhancing heat dissipation performance thereof. Also, the plurality of second partition walls 145b may include the second metal material having high stiffness and high magnetism, thereby securing the stiffness of the heat dissipation member 140 and enhancing magnetism thereof. The display panel 100 according to an embodiment of the present disclosure may easily move between a plurality of processes by using the magnetism of the heat dissipation member 140.

The first partition wall 145a according to the present embodiment may be provided to surround a side surface of the second partition wall 145b, and thus, may be provided in a region which is wider than the second partition wall 145b. The first partition wall 145a provided in a relatively wide region may include the first metal material, and the second partition wall 145b provided in a relatively narrow region may include the second metal material. The first metal material may be lighter in weight than the second metal material having magnetism, thereby preventing an increase in weight of the heat dissipation member 140.

According to another embodiment, the plurality of partition walls 145 may include the plurality of first partition walls 145a including the plastic material and the plurality of second partition walls 145b including the first metal material. In this case, the plurality of second partition walls 145b may include the same material as that of at least one of the first metal layer 141 and the second metal layer 142, but are not limited thereto. The plurality of second partition walls 145b may include a material which differs from that of each of the first metal layer 141 and the second metal layer 142.

The plurality of first partition walls 145a may include a plastic material which is relatively light in weight, compared to the first metal material, thereby securing the stiffness of the heat dissipation member 140 and minimizing or reducing an increase in weight of the heat dissipation member 140. Also, the plurality of second partition walls 145b may include a metal material having high stiffness and high thermal conductivity, thereby securing the stiffness of the heat dissipation member 140 and enhancing heat dissipation performance thereof.

Each of the plurality of first partition walls 145a and the plurality of second partition walls 145b may be provided to have a pattern having a height which is equal to or less than a separation distance between the first metal layer 141 and the second metal layer 142. Each of the plurality of first partition walls 145a and the plurality of second partition walls 145b may have a hexagonal shape where a space is formed therein as illustrated in FIG. 8, but is not limited thereto. The plurality of first partition walls 145a and the plurality of second partition walls 145b may be provided to have various patterns as illustrated in FIG. 9.

Figure 9A:
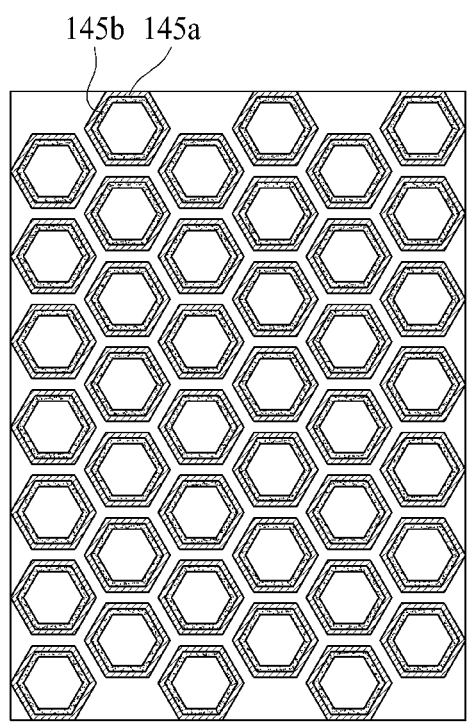
FIGS. 9A to 9E are plan views illustrating various embodiments of a plurality of partition walls illustrated in FIG. 8.

Each of the plurality of second partition walls 145b according to an embodiment may have a hexagonal pattern as illustrated in FIG. 9A and may be apart from adjacent second partition walls 145b. Each of the plurality of first partition walls 145a may be provided to surround a side surface of the second partition wall 145b. Each of the plurality of first partition walls 145a may have a hexagonal pattern like the second partition wall 145b and may be apart from adjacent first partition walls 145a.

Figure 9B:
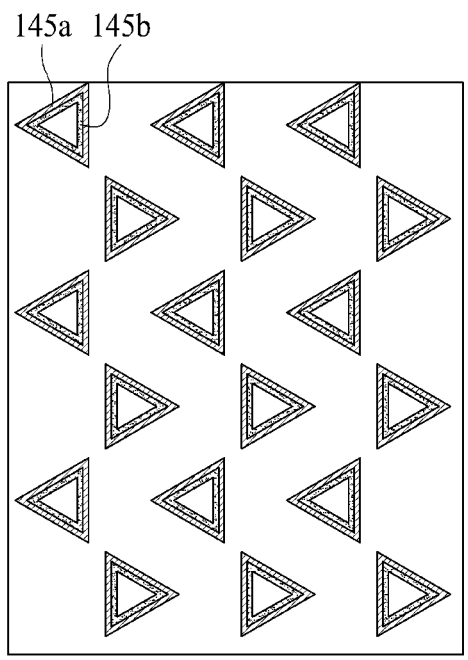

According to another embodiment, the plurality of first partition walls 145a and the plurality of second partition walls 145b may be provided to have a polygonal pattern which differs from that of the partition walls illustrated in FIG. 9A. For example, each of the plurality of second partition walls 145b may have a triangular pattern where a space is formed therein as illustrated in FIG. 9B and may be apart from adjacent second partition walls 145b. Each of the plurality of first partition walls 145a may be provided to surround a side surface of the second partition wall 145b. Each of the plurality of first partition walls 145a may have a hexagonal pattern like the second partition wall 145b and may be apart from adjacent first partition walls 145a.

Figure 9C:
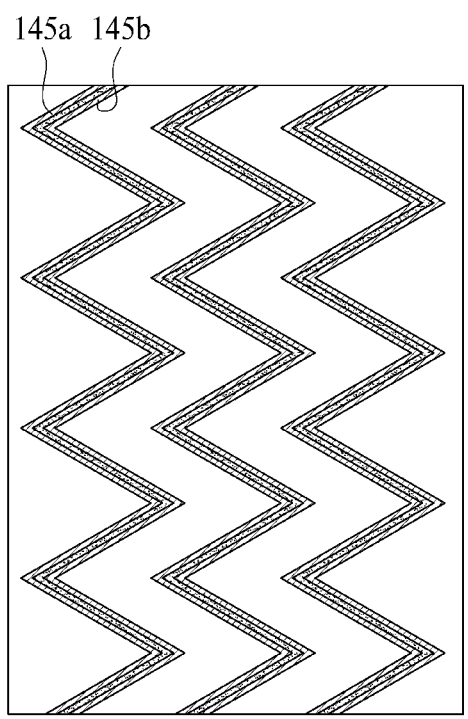
Figure 9D:
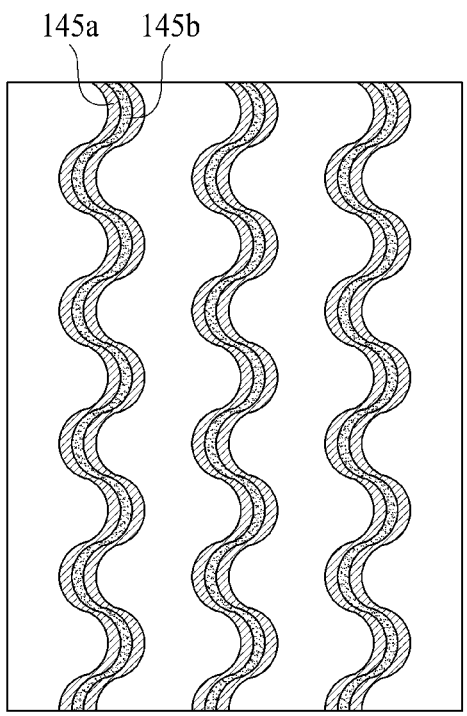

According to another embodiment, the plurality of first partition walls 145a and the plurality of second partition walls 145b may be provided to have a line-shaped pattern unlike the partition walls illustrated in FIGS. 9A and 9B. For example, the plurality of second partition walls 145b may have a zigzag line pattern as illustrated in FIG. 9C and may be apart from adjacent second partition walls 145b. Each of the plurality of first partition walls 145a may be provided to contact a side surface of the second partition wall 145b. The plurality of first partition walls 145a may have a zigzag line pattern like the second partition walls 145b and may be apart from adjacent first partition walls 145a. As another example, the plurality of second partition walls 145b may have a wave line pattern as illustrated in FIG. 9D and may be apart from adjacent second partition walls 145b. Each of the plurality of first partition walls 145a may be provided to contact a side surface of the second partition wall 145b. The plurality of first partition walls 145a may have a wave line pattern like the second partition walls 145b and may be apart from adjacent first partition walls 145a.

Figure 9E:
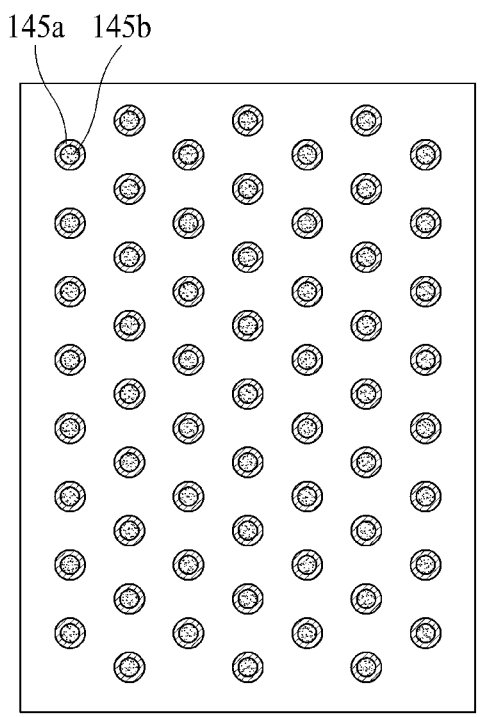

According to another embodiment, the plurality of second partition walls 145b may be provided to have a polygonal or circular pattern where a space is not formed therein, unlike the partition walls illustrated in FIGS. 9A and 9B. For example, the plurality of second partition walls 145b may be provided to have a circular pattern where a space is not formed therein as illustrated in FIG. 9E and may be apart from adjacent second partition walls 145b. The plurality of second partition walls 145b illustrated in FIG. 9E may have a circular pillar shape. Each of the plurality of first partition walls 145a may be provided to surround a side surface of the second partition wall 145b. Each of the plurality of first partition walls 145a may have a circular pattern and may be apart from adjacent first partition walls 145a.

The organic layer 147 may be provided to fill a space which is formed between the first metal layer 141 and the second metal layer 142 by the plurality of first partition walls 145a or the plurality of second partition walls 145b. The organic layer 147 may include one material among acryl resin, epoxy resin, phenolic resin, polyamide resin, polyimide resin, benzocyclobutene resin, and fluorine resin, but is not limited thereto.

In the heat dissipation member 140 according to another embodiment of the present disclosure, the partition wall 145 may include the first partition wall 145a including the first material and the second partition wall 145b including the second material. In this case, the first material and the second material may be materials having different properties. For example, the first material may be a metal material having high stiffness and high thermal conductivity, and the second material may be a metal material having high stiffness and high magnetism. As another example, the first material may be a metal material having high stiffness and high magnetism, and the second material may be a plastic material.

Therefore, the heat dissipation member 140 according to another embodiment of the present disclosure may secure stiffness, considerably enhance heat dissipation performance, and optionally have magnetism. That is, by using one heat dissipation member 140, the display panel 100 according to another embodiment of the present disclosure may realize stiffness, heat dissipation performance, and magnetism.

Figure 10:
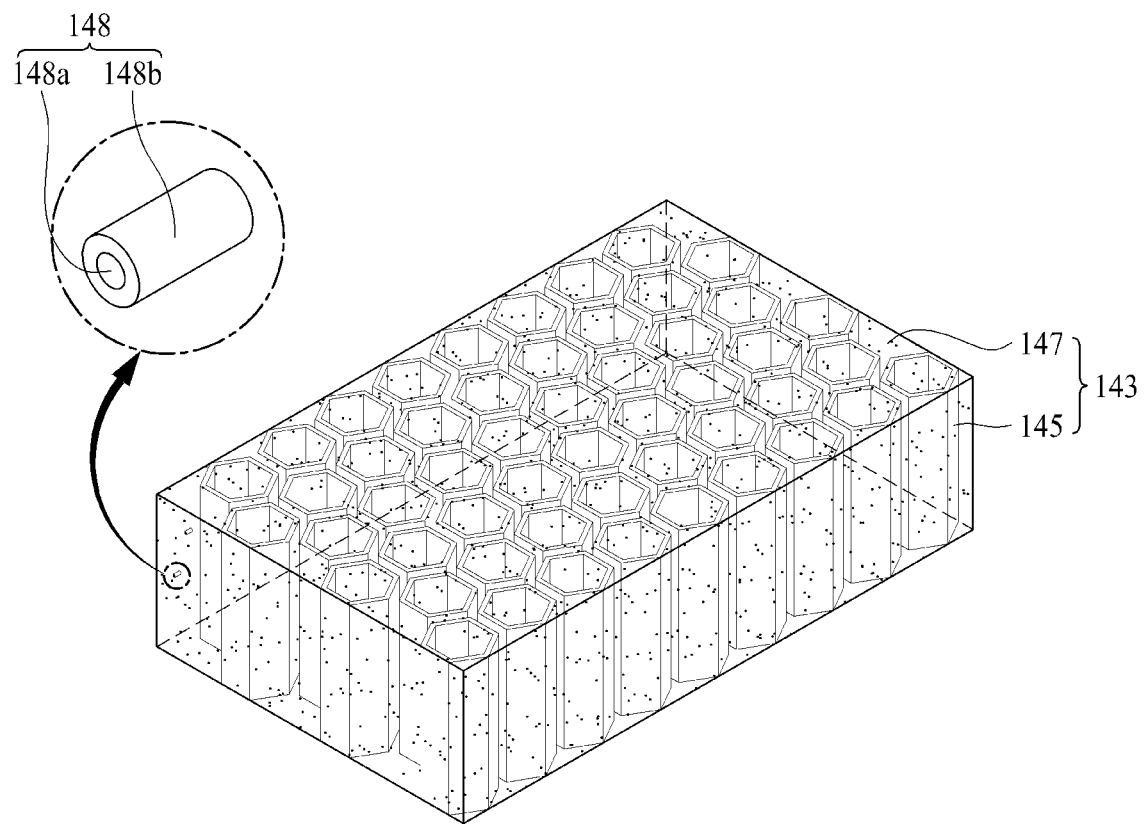
FIG. 10 is a perspective view illustrating another modified embodiment of the middle layer illustrated in FIG. 4.

FIG. 10 is a perspective view illustrating another modified embodiment of the middle layer illustrated in FIG. 4.

Referring to FIG. 10, a middle layer 143 may be provided between a first metal layer 141 and a second metal layer 142. The middle layer 143 may maintain an interval between the first metal layer 141 and the second metal layer 142 and may transfer heat from the first metal layer 141 to the second metal layer 142.

The middle layer 143 may include a plurality of partition walls 145, an organic layer 147, and magnetic particles or magnetizable particles 148. The plurality of partition walls 145 may be arranged at certain intervals between the first metal layer 141 and the second metal layer 142 and may maintain the interval between the first metal layer 141 and the second metal layer 142. The plurality of partition walls 145 may prevent the heat dissipation member 140 from being deformed despite an external impact applied from the outside, and thus, may protect the pixel array layer 120 from the external impact.

Moreover, the plurality of partition walls 145 may receive heat, occurring in the pixel array layer 120, from the first metal layer 141 and may transfer the received heat to the second metal layer 142.

The plurality of partition walls 145 may include a metal material having high stiffness and high thermal conductivity, but is not limited thereto. For example, the plurality of partition walls 145 may include one material among stainless steel, Al, Cu, Ag, a Mg alloy, a Mg—Li alloy, and an Al alloy, but is not limited thereto.

The plurality of partition walls 145 may include the same material as that of at least one of the first metal layer 141 and the second metal layer 142, but is not limited thereto. The plurality of partition walls 145 may include a material which differs from that of each of the first metal layer 141 and the second metal layer 142.

As described above, the plurality of partition walls 145 may include a metal material having high stiffness and high thermal conductivity, thereby securing the stiffness of the heat dissipation member 140 and enhancing heat dissipation performance thereof.

According to another embodiment, the plurality of partition walls 145 may include a plastic material having high stiffness, for securing only stiffness. Since the plurality of partition walls 145 include the plastic material, the stiffness of the heat dissipation member 140 may be secured, and moreover, an increase in weight of the heat dissipation member 140 may be prevented.

Each of the plurality of partition walls 145 may be provided to have a pattern having a height which is equal to or less than a separation distance between the first metal layer 141 and the second metal layer 142. Each of the plurality of partition walls 145 may have a hexagonal pattern where a space is formed therein as illustrated in FIG. 10, but is not limited thereto. The plurality of partition walls 145 may be provided to have various patterns as illustrated in FIG. 5.

The organic layer 147 may be provided to fill a space which is formed between the first metal layer 141 and the second metal layer 142 by the plurality of partition walls 145. The organic layer 147 may include one material among acryl resin, epoxy resin, phenolic resin, polyamide resin, polyimide resin, benzocyclobutene resin, and fluorine resin, but is not limited thereto.

The magnetic particles 148 may be dispersed in the organic layer 147, thereby enabling the heat dissipation member 140 to have magnetism. The magnetic particles 148 may include a magnetic core 148*a*. The magnetic core 148*a* may include a metal material having high magnetism. For example, the magnetic particles 148 may include one of Fe, Ni, and Co, but are not limited thereto.

The magnetic particles 148 may further include an adsorbing material layer 148*b* for adsorbing oxygen or water. The adsorbing material layer 148*b* may be provided to surround at least a portion of a surface of the magnetic core 148*a* and may adsorb or remove water or oxygen flowing in from the outside, based on a physical or chemical reaction. For example, the adsorbing material layer 148*b* may include one of nitride aluminum (AlN), palladium (Pb), Ni, and oxide titanium (TiOx), but is not limited thereto.

The adsorbing material layer 148*b* of the magnetic particles 148 may primarily block penetration of water or oxygen into the pixel array layer 120, thereby preventing a lifetime of the light emitting device from being reduced by water or oxygen and increasing the reliability of the light emitting device.

Figure 11:
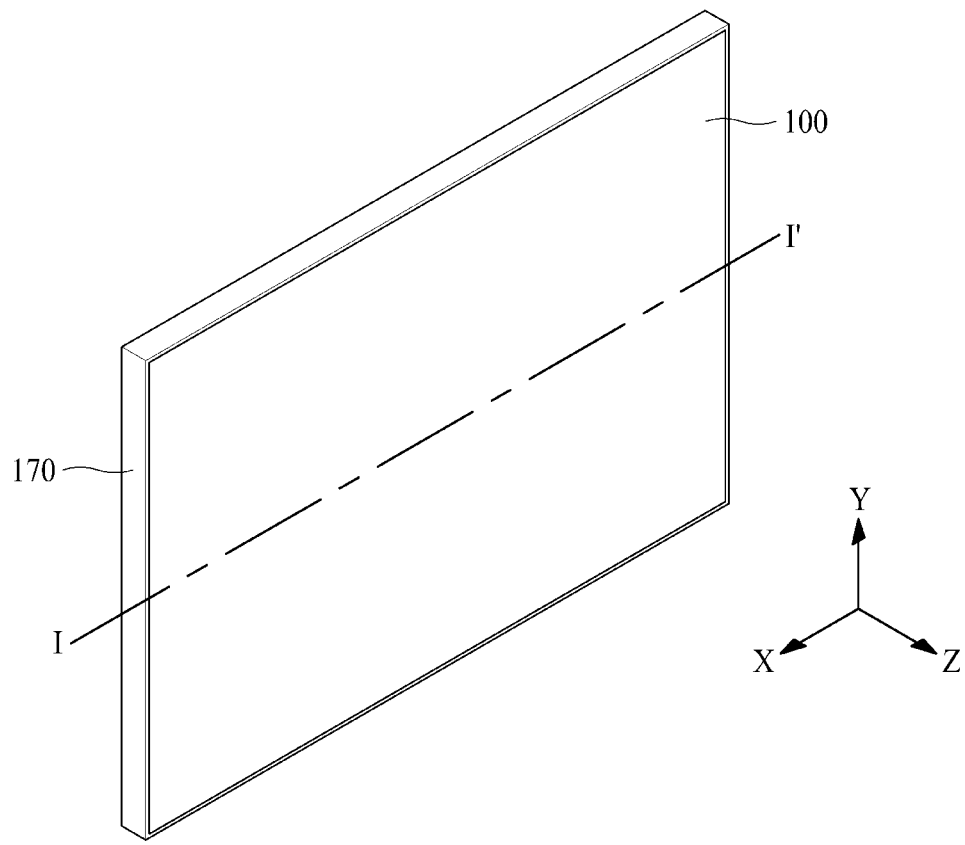
FIG. 11 is a diagram illustrating a display apparatus according to an embodiment of the present disclosure.
Figure 12:
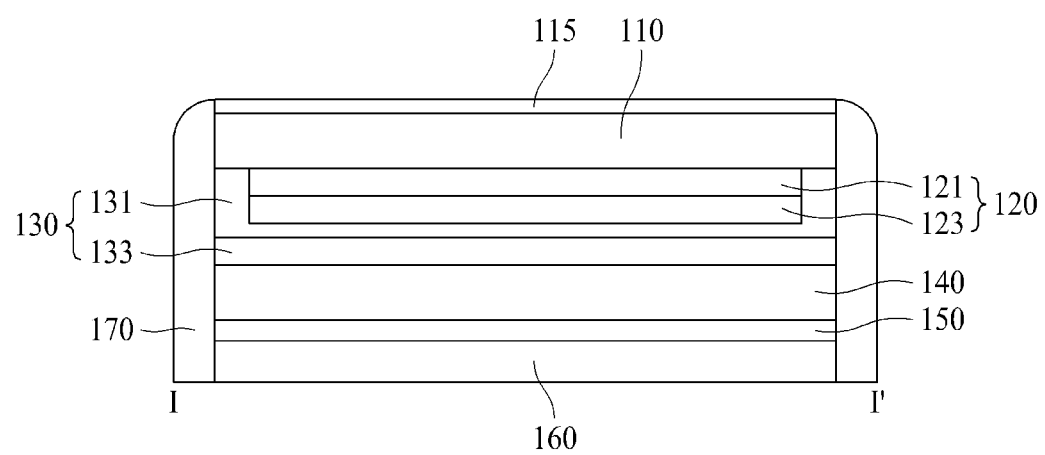
FIG. 12 is a diagram illustrating a cross-sectional surface taken along line I-f of FIG. 11, according to an embodiment of the present disclosure.

FIG. 11 is a diagram illustrating a display apparatus according to an embodiment of the present disclosure, and FIG. 12 is a diagram illustrating a cross-sectional surface taken along line I-I' of FIG. 11, according to an embodiment of the present disclosure.

Referring to FIGS. 11 and 12, the display apparatus according to an embodiment of the present disclosure may include a display panel 100 and a rear structure 160.

The display panel 100 according to an embodiment may be configured as the display panel 100 illustrated in FIG. 1, and thus, its repetitive description is omitted. Also, a heat dissipation member 140 included in the display panel 100 may include one of the heat dissipation members 140 illustrated in FIGS. 1 to 10, and thus, its repetitive description is omitted.

The rear structure 160 may be disposed on a rear surface of the display panel 100. The rear structure 160 according to an embodiment may cover a rear surface of the display panel 100. The rear structure 160 may be referred to as a rear cover, a cover bottom, a plate bottom, a back cover, a base frame, a metal frame, a metal chassis, a chassis base, or an m-chassis. Therefore, the rear structure 160 may be a supporter for supporting the display panel 100 and may be implemented as all types of frame or plate structures disposed on a rear surface of the display apparatus. Also, the rear surface of the display panel 100 may be referred to as one surface, a first surface, a rear surface, or a bottom surface, but the terms are not limited thereto.

The rear structure 160 according to an embodiment may be disposed on the rear surface of the display panel 100 and may cover the rear surface of the display panel 100. The rear structure 160 may protect the rear surface of the display panel 100 from an external impact.

The rear structure 160 according to an embodiment may include one of a glass material, a metal material, and a plastic material. For example, the rear structure 160 may include a glass material, or may include a metal material such as Al having excellent thermal conductivity.

The rear structure 160 according to an embodiment may be coupled to a heat dissipation member 140 by using a coupling member 150. For example, the coupling member 150 may include adhesive resin, a double-sided tape, or a double-side adhesive foam pad and may have elasticity for absorbing an impact.

The coupling member 150 according to an embodiment may be disposed in a whole region between the heat dissipation member 140 and the rear structure 160.

According to another embodiment, the coupling member 150 may be provided in a mesh structure including an air gap between the heat dissipation member 140 and the rear structure 160.

The display apparatus according to an embodiment of the present disclosure may further include a middle frame 170.

The middle frame 170 may be disposed between a rear edge of the display panel 100 and a front edge of the rear structure 160. The middle frame 170 may support an edge of each of the display panel 100 and the rear structure 160 and may surround a side surface of each of the display panel 100 and the rear structure 160.

The front surface of the rear structure 160 may be referred to as the other surface, a second surface, a top surface, or a front surface, but the terms are not limited thereto. Also, the middle frame 170 may be referred to as a middle cabinet, a middle cover, or a middle chassis, but the terms are not limited thereto.

The middle frame 170 according to an embodiment may include a metal material or a plastic material. For example, the middle frame 170 may include a metal material, for improving a side appearance design of the display apparatus and protecting a side surface of the display apparatus.

The middle frame 170 may surround all of an outer surface (or an outer sidewall) of the display panel 100 and an outer surface (or an outer sidewall) of the rear structure 160, and thus, may protect the outer surface of each of the display panel 100 and the rear structure 160 and may improve an appearance design of the display apparatus.

The display apparatus according to an embodiment of the present disclosure may include a panel coupling member instead of the middle frame 170.

In a case where the display apparatus includes the panel coupling member instead of the middle frame 170, the rear structure 160 may include a sidewall cover part which surrounds all of the outer surface (or the outer sidewall) of the display panel 100, the outer surface (or the outer sidewall) of the rear structure 160, and an outer surface (or an outer sidewall) of the panel coupling member.

The sidewall cover part may extend from an end of the rear structure 160 and may be vertically bent in parallel with a thickness direction Z of the display apparatus. The sidewall cover part according to an embodiment may have a single sidewall structure or a hemming structure. The hemming structure may denote structure where ends of an arbitrary member are bent in a curved shape to overlap each other or are apart from each other in parallel. For example, the sidewall cover part having the hemming structure may include a first sidewall, which extends from the end of the rear structure 160 and is bent in parallel with the thickness direction Z of the display apparatus, and a second sidewall which extends from the end of the first sidewall and is bent in parallel with the first sidewall. The second sidewall may be disposed between the outer surface of the display panel 100 and the first sidewall. In this case, the second sidewall may not be exposed at an outermost surface of the display apparatus and may be covered by the sidewall, thereby improving the side appearance design of the display apparatus.

The display panel and the display apparatus including the same according to the present disclosure may be applied to various applications. For example, a display panel and a display apparatus including the same according to the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, TVs, wall paper display apparatuses, signage devices, game machines, notebook computers, monitors, cameras, camcorders, home appliances, etc.

The display panel according to the present disclosure may include a heat dissipation member including a first metal layer, a second metal layer, and a middle layer. In this case, the first metal layer and the second metal layer may include a metal material having high thermal conductivity, and thus, the heat dissipation member according to the present disclosure may efficiently dissipate heat, occurring in a pixel array layer, to the outside.

Moreover, the first metal layer and the second metal layer may be formed to have a thin thickness, and thus, the heat dissipation member according to the present disclosure may prevent the first metal layer and the second metal layer from being sagged by weight. Accordingly, the heat dissipation member according to the present disclosure may prevent a gap from occurring in a side surface, thereby preventing the pixel array layer from being damaged by oxygen or water penetrating through the gap.

Moreover, the heat dissipation member according to the present disclosure may include the middle layer including a plurality of partition walls and an organic layer, and the plurality of partition walls may include a material having high stiffness, thereby securing stiffness. Furthermore, in the heat dissipation member according to the present disclosure, the plurality of partition walls may include a material having high thermal conductivity, thereby enhancing heat dissipation performance.

Moreover, the heat dissipation member according to the present disclosure, a space formed by the plurality of partition walls may be filled with the organic layer, thereby securing stiffness without a large increase in weight.

Moreover, the heat dissipation member according to the present disclosure may dissipate heat, occurring in the pixel array layer, to the outside by using one heat dissipation member, thereby securing stiffness.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display panel comprising:
   a substrate including a display part displaying an image;
   an adhesive layer covering the display part, the adhesive layer on the substrate; and
   a heat dissipation member on the adhesive layer,
   wherein the heat dissipation member comprises:
   a first metal layer and a second metal layer; and
   a middle layer disposed between the first metal layer and the second metal layer, the middle layer including an organic layer and a plurality of partitioned areas filled with the organic layer, wherein the plurality of partitioned areas are formed by a plurality of partition walls, and wherein the plurality of partition walls comprise a first partition wall including a first material and a second partition wall including a second material different from the first material.

2. The display panel of claim 1, wherein the plurality of partition walls have a height equal to or less than a separation distance between the first metal layer and the second metal layer.

3. The display panel of claim 1, wherein a side surface of the heat dissipation member has no gap on the surface.

4. The display panel of claim 1, wherein the plurality of partition walls contact at least one of the first metal layer and the second metal layer.

5. The display panel of claim 1, wherein the plurality of partition walls comprise a same material as a material of at least one of the first metal layer and the second metal layer.

6. The display panel of claim 1, wherein the first material is same as a material of at least one of the first metal layer and the second metal layer.

7. The display panel of claim 1, wherein the second material is a material having magnetism.

8. The display panel of claim 1, wherein the first partition wall surrounds a side surface of the second partition wall.

9. The display panel of claim 1, wherein the first partition wall is disposed between adjacent second partition walls.

10. The display panel of claim 1, wherein the middle layer further comprises a plurality of magnetic particles.

11. The display panel of claim 10, wherein each of the plurality of magnetic particles comprises:
    a magnetic core including a material having magnetism; and
    an adsorbing material layer provided to cover at least a portion of a surface of the magnetic core and to adsorb water or oxygen.

12. The display panel of claim 1, wherein the plurality of partition walls have at least one pattern of a hexagonal pattern, a polygonal pattern, or a triangular pattern.

13. The display panel of claim 1, wherein the plurality of partition walls have at least one pattern of a line-shaped pattern, a zigzag line pattern, or a wave line pattern.

14. A display apparatus comprising:
    the display panel of claim 1; and
    a rear structure disposed on a rear surface of the display panel.

15. The display apparatus of claim 14, further comprising a coupling member coupling the rear structure to the display panel.

16. A display panel comprising:
    a substrate including a display part displaying an image, and
    a heat dissipation member disposed on the substrate;

wherein the heat dissipation member comprises:
a first layer, a second layer, and a middle layer disposed between the first layer and the second layer, the middle layer including a plurality of partitioned areas formed by a plurality of partition walls and an organic layer filling the plurality of partitioned areas, and wherein the plurality of partition walls comprise a first partition wall including a first material and a second partition wall including a second material different from the first material.

17. The display panel of claim 16, wherein the first material is same as a material of at least one of the first layer and the second layer, and the second material is a material having magnetism.

18. The display panel of claim 16, wherein the plurality of partition walls includes a plastic material.

19. The display panel of claim 16, wherein the organic layer contacts the first layer and the second layer.

20. The display panel of claim 19, wherein the organic layer comprises a plurality of magnetic particles.

* * * * *